(12) United States Patent
Abe et al.

(10) Patent No.: US 10,276,757 B2
(45) Date of Patent: Apr. 30, 2019

(54) LIGHT EMITTING DEVICE AND METHOD FOR MANUFACTURING THE SAME

(71) Applicant: NICHIA CORPORATION, Anan-shi (JP)

(72) Inventors: Koji Abe, Tokushima (JP); Yasushi Okamoto, Itano-gun (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/853,962

(22) Filed: Dec. 26, 2017

(65) Prior Publication Data

US 2018/0182933 A1 Jun. 28, 2018

(30) Foreign Application Priority Data

Dec. 27, 2016 (JP) ................. 2016-254332

(51) Int. Cl.
| | |
|---|---|
| H01L 33/54 | (2010.01) |
| H01L 33/50 | (2010.01) |
| H01L 33/44 | (2010.01) |
| F21K 9/90 | (2016.01) |
| F21K 9/60 | (2016.01) |
| H01L 33/60 | (2010.01) |
| H01L 33/00 | (2010.01) |
| H01L 33/56 | (2010.01) |
| F21Y 115/10 | (2016.01) |

(52) U.S. Cl.
CPC ............ *H01L 33/504* (2013.01); *F21K 9/60* (2016.08); *F21K 9/90* (2013.01); *H01L 33/005* (2013.01); *H01L 33/44* (2013.01); *H01L 33/508* (2013.01); *H01L 33/54* (2013.01); *H01L 33/56* (2013.01); *H01L 33/60* (2013.01); *F21Y 2115/10* (2016.08)

(58) Field of Classification Search
None
See application file for complete search history.

(56) References Cited

U.S. PATENT DOCUMENTS

| | | | |
|---|---|---|---|
| 2002/0015193 A1 | 2/2002 | Tabata | |
| 2002/0039001 A1* | 4/2002 | Nagai | ................. H01L 25/0753 313/512 |
| 2005/0151147 A1 | 7/2005 | Izuno et al. | |
| 2005/0152127 A1 | 7/2005 | Kamiya et al. | |
| 2006/0040204 A1 | 2/2006 | Nagahama et al. | |

(Continued)

FOREIGN PATENT DOCUMENTS

| | | |
|---|---|---|
| JP | 07-218705 | 8/1995 |
| JP | 10-48985 | 2/1998 |

(Continued)

*Primary Examiner* — Feifei Yeung Lopez
(74) *Attorney, Agent, or Firm* — Mori & Ward, LLP (57) ABSTRACT

A method for manufacturing a light emitting device includes providing a package having a recess in which a light emitting element is disposed. A translucent sealing material is provided in the recess to encapsulate the light emitting element. A film is provided on the translucent sealing material. The film includes a translucent base material and particles disposed in the translucent base material. The film has a contact surface to contact the translucent sealing material and an outer surface opposite to the contact surface. Abrasive is blasted onto the outer surface of the film to roughen the outer surface so as to expose at least one of the particles.

11 Claims, 8 Drawing Sheets

(56) References Cited

U.S. PATENT DOCUMENTS

| | | |
|---|---|---|
| 2008/0030986 A1 | 2/2008 | Ogawa et al. |
| 2009/0065792 A1 | 3/2009 | Thompson et al. |
| 2010/0167019 A1 | 7/2010 | Ohyanagi et al. |
| 2010/0237382 A1 | 9/2010 | Kamei |
| 2010/0284190 A1 | 11/2010 | Oide et al. |
| 2011/0114989 A1 | 5/2011 | Suehiro et al. |
| 2012/0161621 A1 | 6/2012 | Sato |
| 2013/0011617 A1 | 1/2013 | Tasaki et al. |
| 2013/0320391 A1 | 12/2013 | Koseki et al. |
| 2014/0028173 A1 | 1/2014 | Tsuchiya et al. |
| 2014/0231844 A1 | 8/2014 | Akimoto et al. |
| 2014/0231845 A1 | 8/2014 | Akimoto et al. |
| 2015/0028373 A1 | 1/2015 | Abe et al. |
| 2016/0054486 A1 | 2/2016 | Isojima et al. |
| 2017/0276995 A1 | 9/2017 | Sato et al. |

FOREIGN PATENT DOCUMENTS

| | | |
|---|---|---|
| JP | 2001-257410 | 9/2001 |
| JP | 2001-343531 | 12/2001 |
| JP | 2002-201076 | 7/2002 |
| JP | 2003-086846 | 3/2003 |
| JP | 2004-221163 | 8/2004 |
| JP | 2004-231513 | 8/2004 |
| JP | 2005-064111 | 3/2005 |
| JP | 2005-183777 | 7/2005 |
| JP | 4442216 B2 | 7/2005 |
| JP | 4238792 B2 | 2/2006 |
| JP | 2007-243053 | 9/2007 |
| JP | 2007-266246 | 10/2007 |
| JP | 2007-324220 | 12/2007 |
| JP | 2008-060068 | 3/2008 |
| JP | 2009-070869 | 4/2009 |
| JP | 4678437 B2 | 7/2010 |
| JP | 2011-129862 | 6/2011 |
| JP | 2012-151466 | 8/2012 |
| JP | 2013-218245 | 10/2013 |
| JP | 2013-251504 | 12/2013 |
| JP | 2014-041993 | 3/2014 |
| JP | 2014-157989 | 8/2014 |
| JP | 2014-157990 | 8/2014 |
| JP | 2014-241313 | 12/2014 |
| JP | 2015-026698 | 2/2015 |
| JP | 2015-173287 | 10/2015 |
| JP | 2016-021435 | 2/2016 |
| JP | 2016-046262 | 4/2016 |
| JP | 2016-136232 | 7/2016 |
| WO | WO 2008/023797 | 2/2008 |
| WO | WO 2009/054088 | 4/2009 |
| WO | WO 2011/118108 | 9/2011 |
| WO | WO 2013/157310 | 10/2013 |
| WO | WO 2016/113970 | 7/2016 |

* cited by examiner

LIGHT EMITTING DEVICE AND METHOD FOR MANUFACTURING THE SAME

CROSS-REFERENCE TO RELATED APPLICATION

This application claims priority under 35 U. S. C. § 119 to Japanese Patent Application No. 2016-254332 filed on Dec. 27, 2016, the contents of this application are hereby incorporated herein by reference in their entirety.

BACKGROUND

Technical Field

This disclosure relates to a light emitting device and a method for manufacturing the light emitting device.

Description of Background

Light emitting diodes (LEDs) are used in various applications including lighting devices, backlights for liquid crystal displays used in personal computers (PCs) and televisions, large displays, and so forth. LED light sources are facing an increase in demand for the various applications as mentioned above as well as an increasing need for improving light output therefrom. For example, Japanese Unexamined Patent Application Publication No. 2003-086846 discloses a light emitting device in which a film containing a light diffusion member is formed on an upper surface of a sealing resin of the light emitting device.

SUMMARY OF INVENTION

According to an embodiment of the present disclosure, a method for manufacturing a light emitting device includes providing a package having a recess in which a light emitting element is disposed. A translucent sealing material is provided in the recess to encapsulate the light emitting element. A film is provided on the translucent sealing material. The film includes a translucent base material and particles disposed in the translucent base material. The film has a contact surface to contact the translucent sealing material and an outer surface opposite to the contact surface. Abrasive is blasted onto the outer surface of the film to roughen the outer surface so as to expose at least one of the particles.

According to an embodiment of the present disclosure, a light emitting device includes a package having a recess, a light emitting element disposed in the recess, a translucent sealing material provided in the recess to encapsulate the light emitting element, and a film provided on the translucent sealing material. The film has a contact surface to contact the translucent sealing material and an outer surface opposite to the contact surface. The film includes a translucent base material and two or more layers of particles stacked in the translucent base material between the contact surface and the outer surface. At least one of the particles is exposed in a vicinity of the outer surface of the film.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DETAILED DESCRIPTION OF EMBODIMENTS

The embodiments will now be described with reference to the accompanying drawings, wherein like reference numerals designate corresponding or identical elements throughout the various drawings.

Light emitting devices and methods for manufacturing the light emitting devices according to embodiments will be described below. Note that drawings used for reference in the following description schematically illustrate this embodiment. For this reason, scales, intervals, positional relations, and the like of components may be exaggerated or illustration of some of the components may be omitted. Moreover, in the following description, the components having the same names or denoted by the same reference numerals represent the same or similar components in principle, and detailed explanations thereof will be omitted as appropriate.

First Embodiment

Constitution of Light Emitting Device

Figure 2:
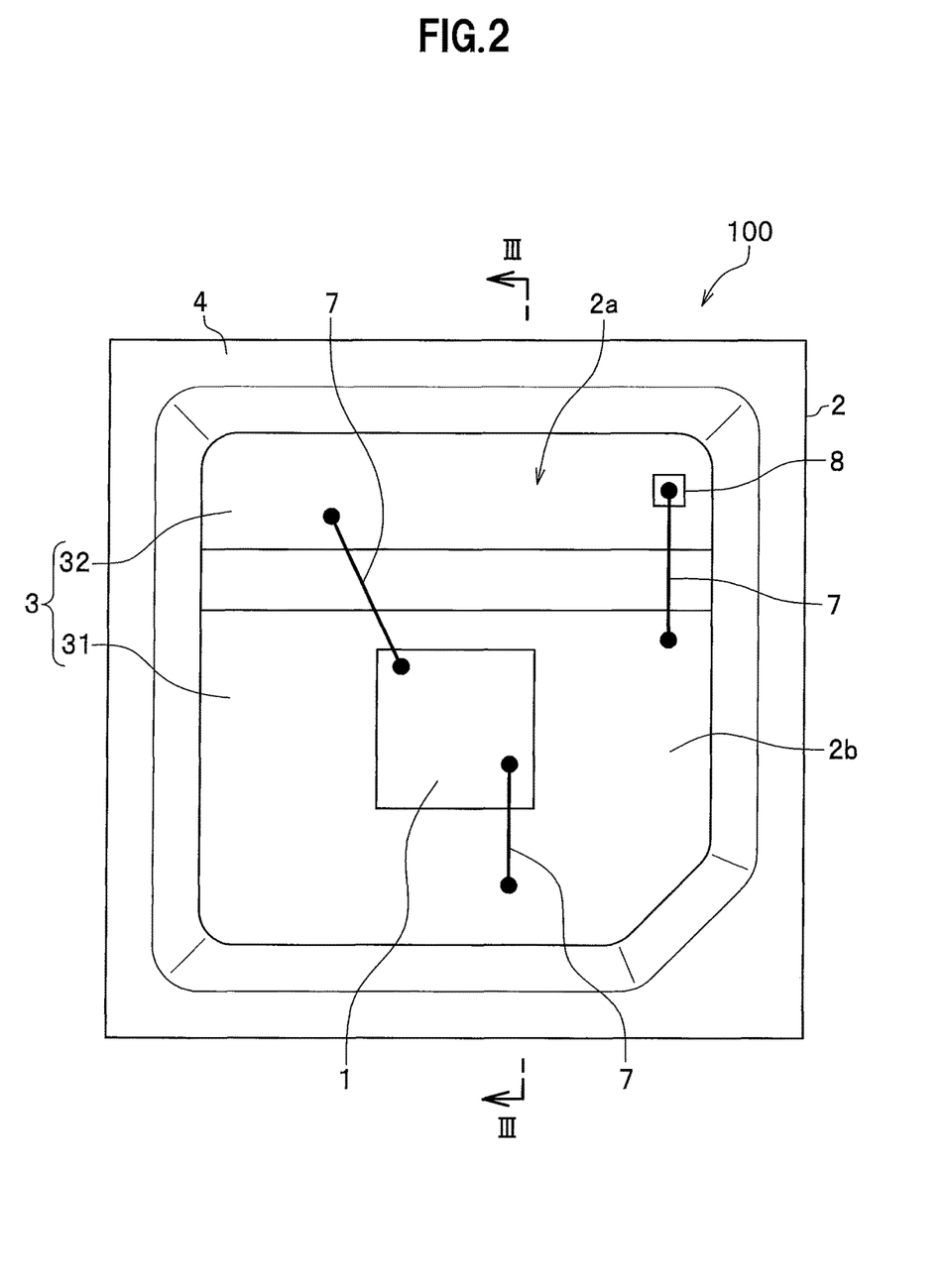
FIG. 2 is a schematic plan view illustrating the constitution of the light emitting device according to the first embodiment.
Figure 3:
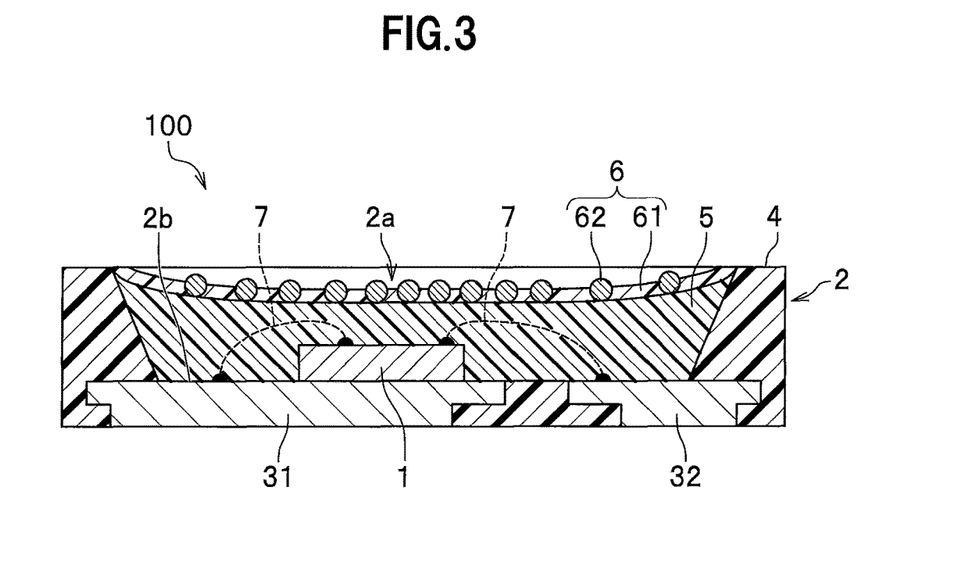
FIG. 3 is a schematic cross-sectional view illustrating the constitution of the light emitting device according to the first embodiment, which shows a cross section taken along the III-III line in FIG. 2.

A constitution of a light emitting device according to a first embodiment will be described below with reference to FIG. 1 to FIG. 3.

Figure 1:
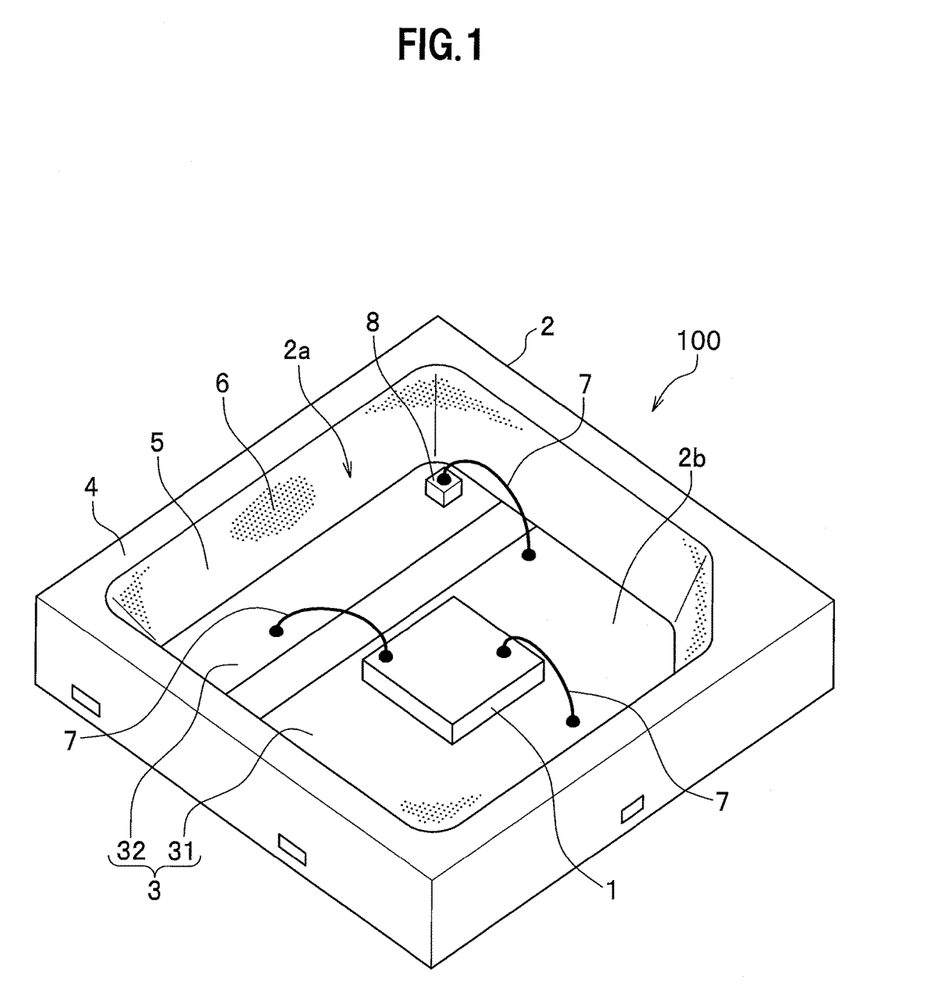
FIG. 1 is a schematic perspective view illustrating a constitution of a light emitting device according to a first embodiment.

FIG. 1 is a schematic perspective view illustrating the constitution of a light emitting device according to a first embodiment. FIG. 2 is a schematic plan view illustrating the constitution of the light emitting device according to the first embodiment. FIG. 3 is a schematic cross-sectional view illustrating the constitution of the light emitting device according to the first embodiment, which shows a cross section taken along the III-III line in FIG. 2.

Note that hatching in FIG. 1 indicates the presence of a film 6 in a first recess 2a. In the meantime, FIG. 1 and FIG. 2 illustrate components in the first recess 2a, which are seen through the translucent film 6 and a translucent sealing member (a translucent sealing material) 5 disposed below the film 6, respectively.

A light emitting device 100 according to the first embodiment includes: a package 2 having a substantially square shape in a plan view and including the first recess 2a which is opened to an upper surface side; a light emitting element 1 mounted in the first recess 2a; the sealing member 5 disposed in the first recess 2a and encapsulating the light emitting element 1; and the film 6 formed on the sealing member 5. The film 6 is provided with multiple projections that are formed by particles 62 contained in a base material 61 of the film 6. Meanwhile, the package 2 includes lead electrodes 3 and a light shielding member 4.

The light emitting element 1 is die-bonded onto a lead electrode 31 disposed on a bottom surface 2b of the first recess 2a. An anode electrode being one of electrodes of the light emitting element 1 is electrically connected to a lead electrode 32 by using a wire 7. A cathode electrode being another electrode of the light emitting element 1 is electrically connected to the lead electrode 31 by using another wire 7.

As for an emission color of the light emitting element 1, a color of any wavelength can be selected depending on the usage. The light emitting element 1 that emits blue light or green light may preferably employ a light emitting element made of nitride semiconductor expressed by $In_XAl_YGa_{1-X-Y}N$ ($0 \leq X \leq 1$, $1 \leq Y \leq 1$, $X+Y \leq 1$), which has an emission wavelength in a range of near-ultraviolet light to visible light.

A protection element 8 is mounted in the first recess 2a of the light emitting device 100. Here, the protection element 8 is a Zener diode, for example.

The first recess 2a of the package 2 is a region for mounting the light emitting element 1. The bottom surface 2b of the first recess 2a is formed of the lead electrodes 3 and the light shielding member 4. Side walls of the first recess 2a are formed of the light shielding member 4. A lower surface of the package 2 is a flat surface and is designed to expose the lead electrodes 3. This lower surface constitutes a mounting surface of the light emitting device 100.

The lead electrodes 3 include the lead electrode 31 and the lead electrode 32 each in a flat plate shape, which are provided separately from each other at the bottom of the package 2. Part of upper surfaces of the lead electrodes 31 and 32 constitute the bottom surface 2b of the first recess 2a. Here, the one electrode of the protection element 8 provided on the lower surface side is die-bonded and thus electrically connected to the lead electrode 32, and the other electrode thereof provided on the upper surface side is electrically connected to the lead electrode 31 through the wire 7.

For example, a Cu-based alloy is used as a material of the lead electrodes 3.

The upper surfaces of the lead electrodes 3 constituting the bottom surface 2b of the first recess 2a may be plated with Ag, Au, Ni, or the like in order to improve light reflectivity and/or adhesion to the wire 7, a die-bonding member, and the like.

The light shielding member 4 is a member designed to fix the two lead electrodes 31 and 32 separately from each other and to constitute the side walls of the first recess 2a. The light shielding member 4 is formed of a material that shields light while inhibiting transmission of the light, and either a light reflective material designed to shield light by reflecting the light or a light absorptive material designed to shield light by absorbing the light is used therein.

Examples of a resin used for a matrix of the light shielding member 4 include thermoplastic resins and thermosetting resins.

Examples of thermoplastic resins include polyphthalamide resin, liquid crystal polymers, poly butylene terephthalate (PBT), and unsaturated polyesters.

Examples of thermosetting resins include epoxy resins, modified epoxy resins, silicone resins, and modified silicone resins.

In regard to the light shielding member 4 having light reflective properties, the light shielding member 4 can be formed of a resin material to which light reflective properties are imparted by incorporating a light reflective substance in the matrix. Examples of the light reflective substance include $TiO_2$, $Al_2O_3$, $ZrO_2$, $MgO$, and the like.

In regard to the light shielding member 4 having light absorbing properties, the light shielding member 4 can be formed of a resin material to which light absorbing properties are imparted by incorporating a light absorptive substance in the matrix. A black pigment may be an example of the light absorptive substance. To be more precise, examples of the black pigment include carbon black, graphite, and the like.

The sealing member 5 is provided in the first recess 2a of the package 2, and encapsulates the light emitting element 1 and the protection element 8. A filling amount of a resin constituting the sealing member 5 only needs to be set to a sufficient amount for covering electronic components such as the light emitting element 1 as well as the wires 7 and the like. In order to minimize the filling amount of this material, the sealing member 5 may have a second recess (a substantially curved concave shape). The second recess has a substantially curved form in cross-sectional view passing through an optical axis of the light emitting element 1. The light emitting element 1 is disposed immediately below a portion in a vicinity of a center of the second recess of the sealing member 5. Note that the surface of the sealing member 5 may be formed into a flat shape instead of providing the second recess. Meanwhile, when a lens function is imparted to the sealing member 5, the sealing member 5 may be formed into a bullet shape or a convex lens shape by raising the surface of the sealing member 5.

A translucent thermosetting resin can be used as a resin constituting the sealing member 5. Examples of the thermosetting resin include a silicone resin, an epoxy resin, a urea resin, and the like. In addition to the above-mentioned materials (base materials), the sealing member 5 may also contain a wavelength conversion substance, the above-described light reflective substance, and the like in order to provide certain functions thereto.

The sealing member 5 may also contain particles of the light absorptive substance such as carbon black as another filler to the extent not damaging the translucency. In this way, it is possible to improve a light distribution characteristic of light emitted from the light emitting device 100.

The wavelength conversion substance is disposed mainly around the light emitting element 1 and in the vicinity of the bottom surface 2b of the first recess 2a. The wavelength conversion substance is a phosphor which performs wavelength conversion by absorbing part or all of the light from the light emitting element 1 and emitting light at a different wavelength. For example, it is possible to produce white light by combining the light emitting element 1 that emits blue light with the wavelength conversion substance that absorbs the blue light and emits yellow light. The wavelength conversion substance preferably has larger specific gravity than that of the uncured base material of the sealing member 5 at the time of manufacture.

Examples of the wavelength conversion substance include: yellow phosphors such as YAG phosphor expressed by $Y_3Al_5O_{12}$:Ce and a silicate; and red phosphors such as CASN phosphor expressed by $CaAlSiN_3$:Eu and KSF phosphor expressed by $K_2SiF_6$:Mn.

The film 6 contains the particles 62 as a filler for adjusting viscosity of the uncured resin at the time of formation by using the translucent resin as the base material 61, and for imparting light diffuseness to the film 6. In the meantime, at least part of the particles 62 are partially exposed from the base material 61, and an upper surface (an outer surface) of the film 6 is thus provided with multiple projections originating from the particles 62.

A translucent thermosetting resin can be used as the base material 61 of the film 6. Examples of the thermosetting resin include silicone resin, epoxy resin, urea resin, and the like.

A material having a lower refractive index than that of the base material 61 is used for the particles 62. Specifically, the particles 62 may be formed of silica ($SiO_2$), for example. When silicone resin having the refractive index of 1.52 is used as the base material 61, for example, it is possible to employ $SiO_2$ having the refractive index of 1.46 as the particles 62.

Grain sizes of the particles 62 are preferably set in a range from about 0.5 micrometer ($\mu$m) to 12.5 micrometer ($\mu$m) inclusive. By setting the grain sizes of the particles 62 within this range, it is possible to efficiently reduce regular reflection light components of external light on the upper surface of the film 6 by using the multiple projections formed originating from the particles 62.

Note that values of grain sizes of various fillers, abrasive materials, and the like in this specification are in accordance with an air permeability method or Fisher-SubSieve-Sizers-No. (F. S. S. method) unless otherwise specified.

A density of the particles 62 in the film 6 is high. The area occupied by the particles 62 therein is in a range of 2% to 20%, or preferably in a range of 3% to 10%, or more preferably in a range of 4% to 8%. This density corresponds to a case of measuring the area of 1 mm$^2$ in a vicinity of the center of the first recess 2a in a plan view.

By exposing the particles 62 having the lower refractive index than that of the base material 61 on the upper surface of the film 6 serving as a light extraction plane of the light emitting device 100, it is possible to reduce a difference in refractive index between the film 6 and the air (with the refractive index of 1.0) that serves as a medium at a destination of the extracted light. With the difference in refractive index equal to 0.03 or more than between the base material 61 and the particles 62 in the film 6, it is possible to improve light extraction efficiency of the light emitting device 100 as a consequence of exposing the particles 62.

The provision of the multiple projections on the upper surface of the film 6 establishes point contact of the upper surface with another component as the contact arises. Thus, it is possible to prevent the other component in contact from tacking (adhesion), and to facilitate handling of the light emitting device 100 during manufacturing and mounting procedures.

The multiple projections on the upper surface of the film 6 can be formed by abrasive-blasting the upper surface of the film 6 to expose at least part of the particles 62 partially from the base material 61. In other words, the multiple projections on the upper surface of the film 6 are preferably formed originating from the particles 62.

The regular reflection light components of the external light reflected from the upper surface of the film 6 can be favorably reduced by the multiple projections formed originating from the particles 62 having the grain sizes in the aforementioned range.

In the film 6, the density of the particles 62 to be disposed in the vicinity of the center of the second recess of the sealing member 5 is higher than the density of the particles 62 to be disposed in a periphery portion of the second recess of the sealing member 5. Here, the light emitting element 1 is disposed immediately below the portion in the vicinity of the center of the second recess of the sealing member 5. Accordingly, it is possible to improve the light diffuseness and the reflectivity by setting the density of the particles 62 disposed immediately above the light emitting element 1 higher than the density of the particles 62 disposed in the periphery portion of the second recess of the sealing member 5.

The surface tackiness of the light emitting device is thought to be highest at the portion in the vicinity of the center of the upper surface of the light emitting device. Therefore, it is possible to reduce the surface tackiness by increasing the density of the particles 62 to be disposed in the vicinity of the center of the second recess of the sealing member 5 more than the density of the particles 62 to be disposed in the periphery portion of the second recess of the sealing member 5.

Since the multiple projections on the upper surface of the film 6 can be formed by abrasive-blasting the upper surface of the film 6 to expose at least part of the particles 62 partially from the base material 61, an amount of grinding the portion in the vicinity of the center of the second recess of the sealing member 5 and an amount of grinding the portion in the periphery portion of the second recess of the sealing member 5 can be equalized easily. For this reason, the film 6 has a characteristic that a ratio of exposure of the particles 62 disposed in the vicinity of the center of the second recess of the sealing member 5 is substantially equal to a ratio of exposure of the particles 62 disposed in the periphery portion of the second recess of the sealing member 5.

Each wire 7 is a line to electrically connect the electronic component such as the light emitting element 1 and the protection element 8 to the lead electrode 31 or 32. Examples of the material of the wires 7 include metals such as Au, Ag, Cu, Pt, and Al, and alloys thereof. In particular, it is preferable to use Au for its excellence in heat conductivity and other factors.

Operation of Light Emitting Device

Next, an operation of the light emitting device 100 will be described with reference to FIG. 3. Note that the following description is based on an assumption that the upper surface of the film 6 serving as the light extraction plane of the light emitting device 100 is in contact with the air.

The light emitting element 1 emits the light as a consequence of connecting an external power source to the lead electrodes 31 and 32. The light from the light emitting element 1 propagates in the sealing member 5. Part or all of the light from the light emitting element 1 undergoes the wavelength conversion by the wavelength conversion substance, then advances either directly or through reflection from the bottom surface and inner side surfaces of the first recess 2a, and gets taken out of the upper surface of the film 6 to the outside. On the upper surface of the film 6, the light from the light emitting element 1 is taken out to the outside partially through an interface between the base material 61 and the air. Meanwhile, at a portion where any of the particles 62 is disposed in the vicinity of the upper surface of the film 6, the light from the light emitting element 1 is taken out to the outside through an interface between the particle 62 and the air. The light that passes through the interface between the particle 62 and the air can reduce more light reflection on the interface with the air than does the light that passes through the interface between the base material 61 and the air. As a consequence, it is possible to improve light extraction efficiency of the light emitting device 100.

Meanwhile, when the light propagates from a medium having a relatively higher refractive index to a medium having a lower refractive index, the light is totally reflected from an interface based on the Snell's law. An amount of light totally reflected from the interface can be reduced by diminishing the difference in refractive index on the interface between the film 6 and the air. That is to say, the extraction efficiency of the light to the outside can be improved from the viewpoint of reduction in the total reflection as well.

Moreover, it is possible to bring the light into diffuse reflection by providing the upper surface of the film 6 with the projections originating from the grain sizes of the particles 62. In other words, the regular reflection light components can be reduced. For this reason, it is possible to reduce deterioration in contrast of brightness of the light emitted from the light emitting device 100 when observed in the direction of regular reflection of the external light.

Manufacturing Method for Light Emitting Device

Next, a manufacturing method for a light emitting device according to the first embodiment will be described with reference to FIG. 4 to FIG. 11B.

Figure 4:
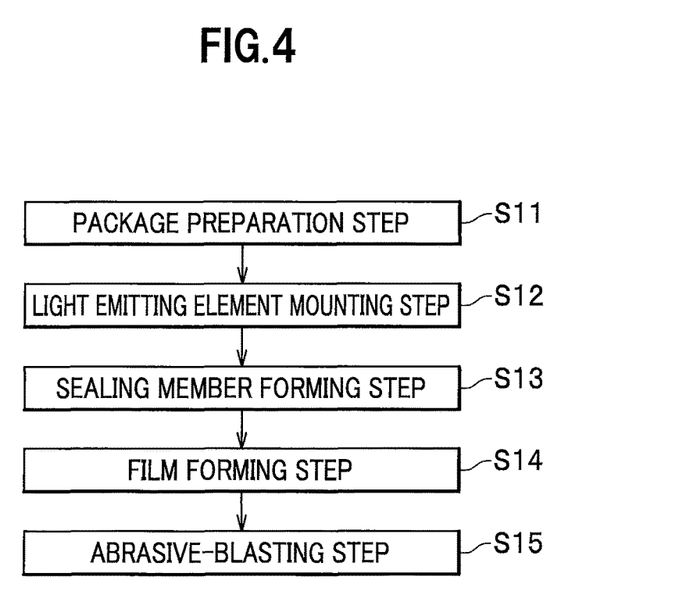
FIG. 4 is a flowchart illustrating procedures of a method for manufacturing the light emitting device according to the first embodiment.
Figure 5:
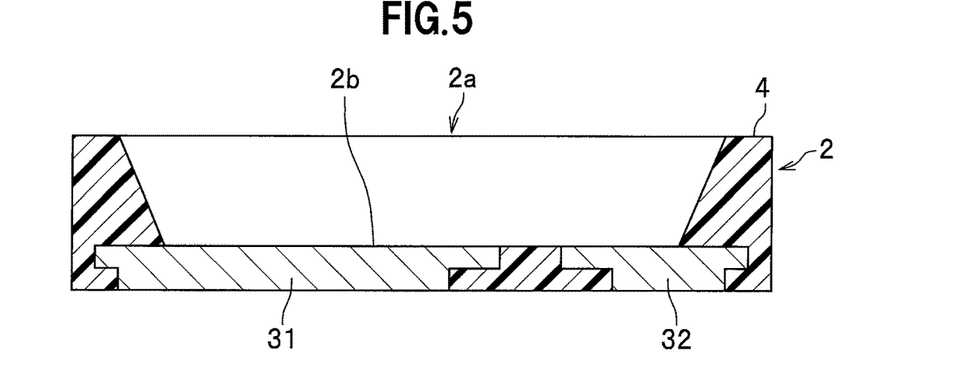
FIG. 5 is a schematic cross-sectional view illustrating a constitution of a package prepared in a package preparation step of the method for manufacturing the light emitting device according to the first embodiment.
Figure 6:
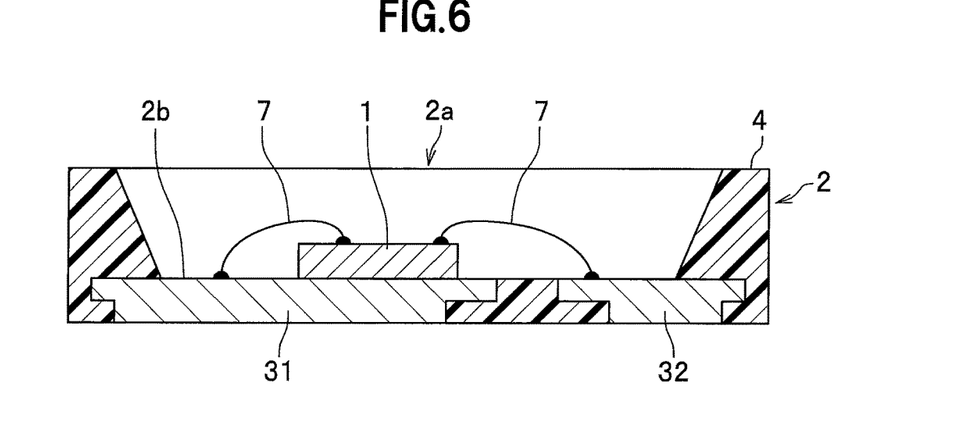
FIG. 6 is a schematic cross-sectional view illustrating a light emitting element mounting step of the method for manufacturing the light emitting device according to the first embodiment.
Figure 7:
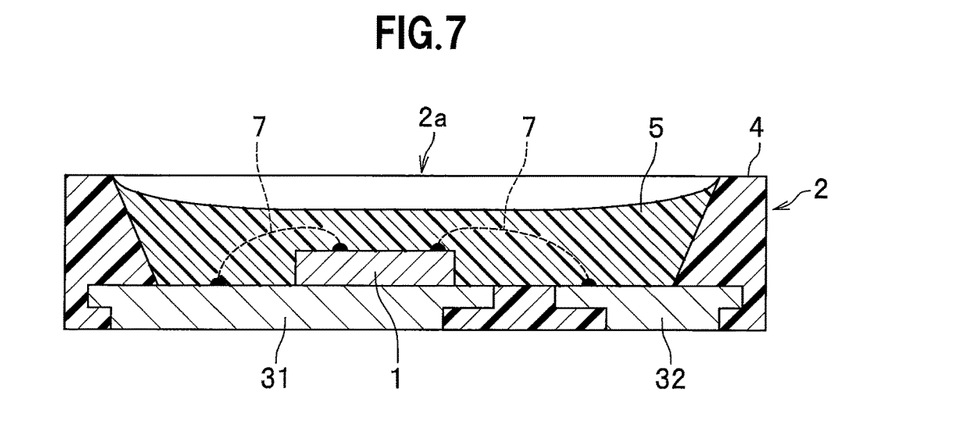
FIG. 7 is a schematic cross-sectional view illustrating a sealing member forming step of the method for manufacturing the light emitting device according to the first embodiment.
Figure 8:
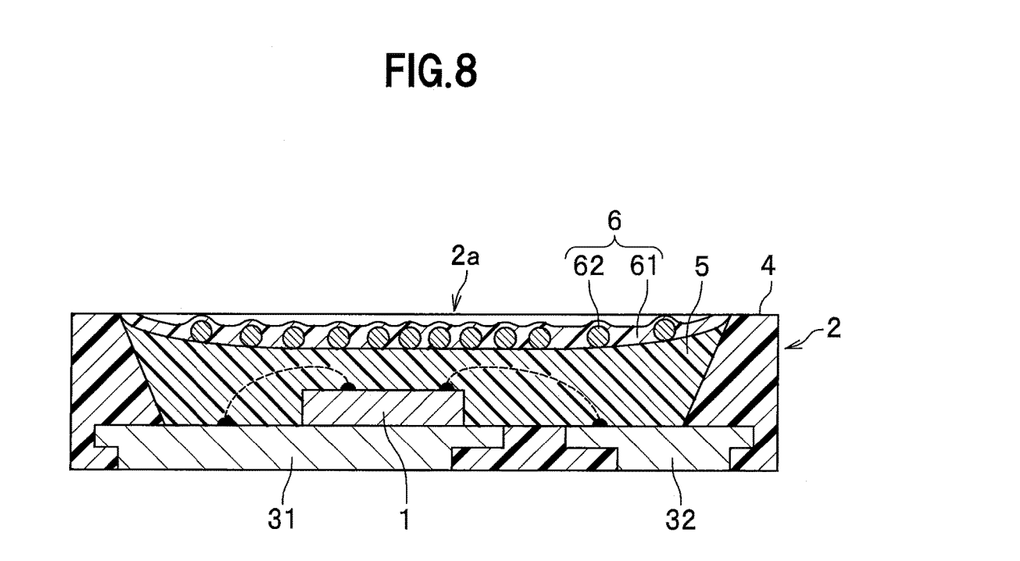
FIG. 8 is a schematic cross-sectional view illustrating a film forming step of the method for manufacturing the light emitting device according to the first embodiment.
Figure 9:
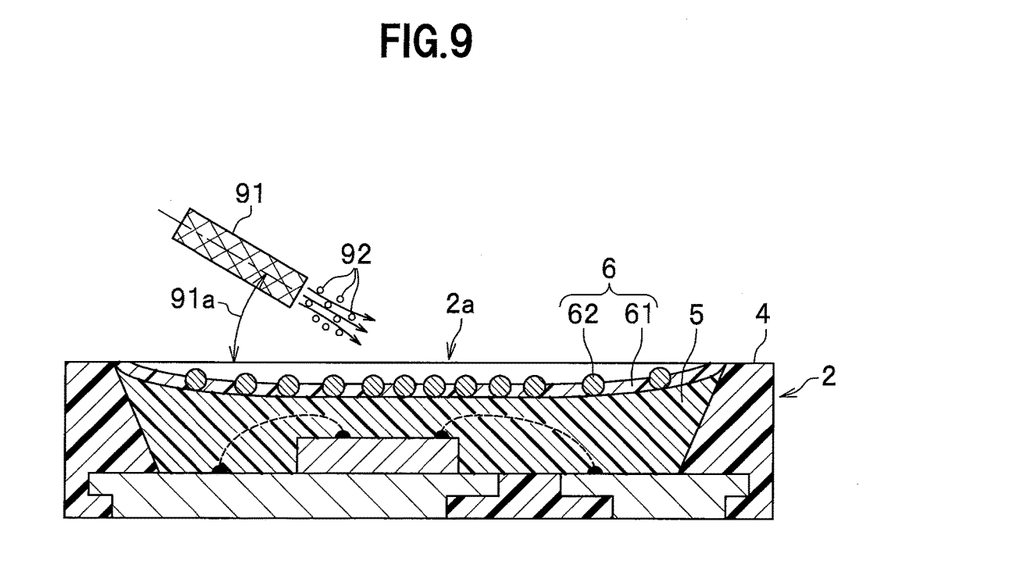
FIG. 9 is a schematic cross-sectional view illustrating an abrasive-blasting step of the method for manufacturing the light emitting device according to the first embodiment.
Figure 10A:
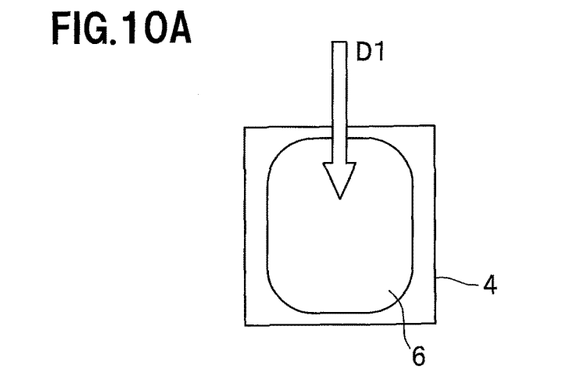
FIG. 10A is a schematic plan view of a first example of a direction in which an abrasive material is jetted in the abrasive-blasting step in the method for manufacturing the light emitting device according to the first embodiment.
Figure 10B:
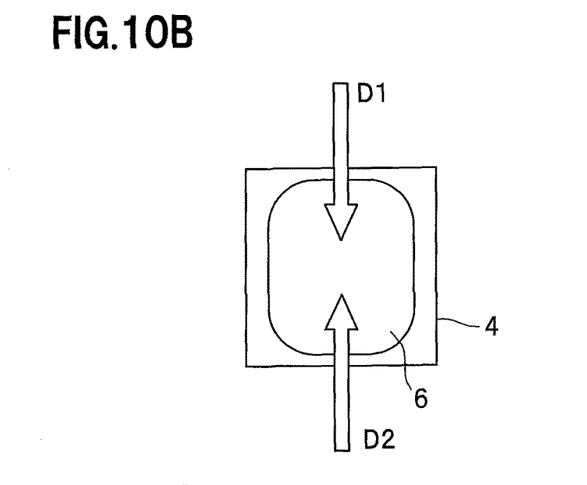
FIG. 10B is a schematic plan view of a second example of directions in which the abrasive material is jetted in the abrasive-blasting step in the method for manufacturing the light emitting device according to the first embodiment.
Figure 10C:
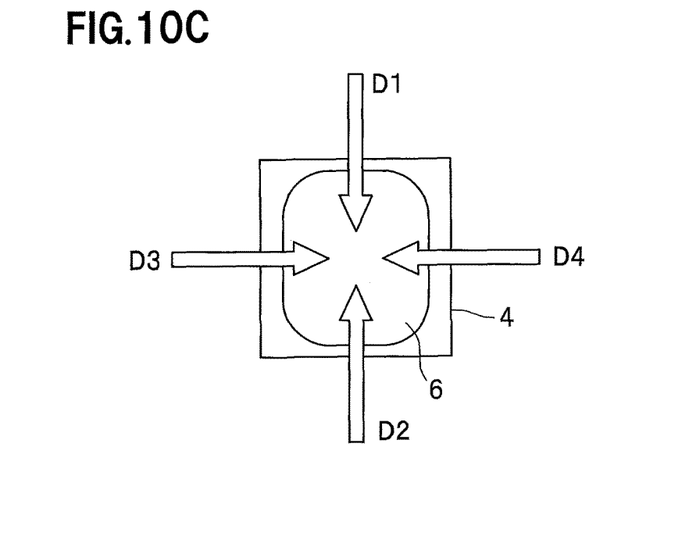
FIG. 10C is a schematic plan view of a third example of directions in which the abrasive material is jetted in the abrasive-blasting step in the method for manufacturing the light emitting device according to the first embodiment.
Figure 11A:
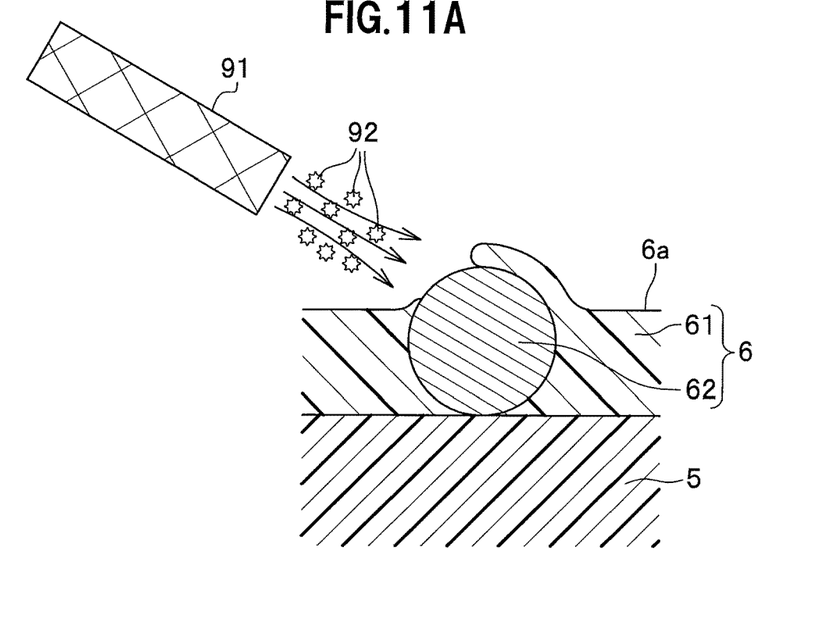
FIG. 11A is a schematic cross-sectional view illustrating a first substep in the abrasive-blasting step in the method for manufacturing the light emitting device according to the first embodiment.
Figure 11B:
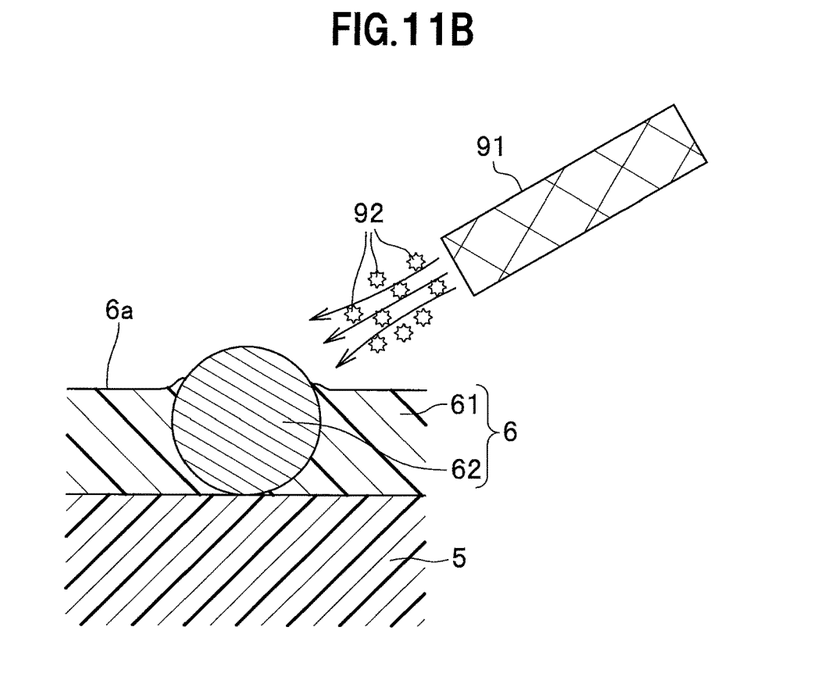
FIG. 11B is a schematic cross-sectional view illustrating a second substep in the abrasive-blasting step in the method for manufacturing the light emitting device according to the first embodiment.

FIG. 4 is a flowchart illustrating procedures of the method for manufacturing the light emitting device according to the first embodiment. FIG. 5 is a schematic cross-sectional view illustrating a constitution of a package prepared in a package preparation step of the method for manufacturing the light emitting device according to the first embodiment. FIG. 6 is a schematic cross-sectional view illustrating a light emitting element mounting step of the method for manufacturing the light emitting device according to the first embodiment. FIG. 7 is a schematic cross-sectional view illustrating a sealing member forming step of the method for manufacturing the light emitting device according to the first embodiment. FIG. 8 is a schematic cross-sectional view illustrating a film forming step of the method for manufacturing the light emitting device according to the first embodiment. FIG. 9 is a schematic cross-sectional view illustrating an abrasive-blasting step of the method for manufacturing the light emitting device according to the first embodiment. FIG. 10A is a schematic plan view of a first example of a direction in which an abrasive material is jetted in the abrasive-blasting step in the method for manufacturing the light emitting device according to the first embodiment. FIG. 10B is a schematic plan view of a second example of directions in which the abrasive material is jetted in the abrasive-blasting step in the method for manufacturing the light emitting device according to the first embodiment. FIG. 10C is a schematic plan view of a third example of directions in which the abrasive material is jetted in the abrasive-blasting step in the method for manufacturing the light emitting device according to the first embodiment. FIG. 11A is a schematic cross-sectional view illustrating a first substep in the abrasive-blasting step in the method for manufacturing the light emitting device according to the first embodiment. FIG. 11B is a schematic cross-sectional view illustrating a second substep in the abrasive-blasting step in the method for manufacturing the light emitting device according to the first embodiment.

The method for manufacturing the light emitting device 100 according to the first embodiment includes a package preparation step S11, a light emitting element mounting step S12, a sealing member forming step S13, a film forming step S14, and an abrasive-blasting step S15.

The package preparation step S11 is a step of preparing the package 2 including the lead electrodes 3 disposed on the bottom surface 2b, and the first recess 2a opened upward while being surrounded by the light shielding member 4 serving as the side walls.

First, a lead frame provided with external forms of the lead electrodes 3 is formed by pressing and blanking a metal plate. Next, the lead frame is sandwiched between upper and lower molds provided with a cavity corresponding to the shape of the light shielding member 4. Next, a resin material is injected into the cavity inside the molds and the resin material is taken out after being solidified or cured. Thus, the package 2 is prepared in which the light shielding member 4 is formed integrally with the lead electrodes 3.

The light emitting element mounting step S12 is a step of mounting the light emitting element 1 in the first recess 2a of the package 2. The light emitting element 1 is die-bonded onto the lead electrode 31, and each light emitting element 1 is electrically connected to the corresponding lead electrodes 31 and 32 by using the wires 7. Here, the protection element 8 is also mounted in the first recess 2a.

The sealing member forming step S13 is a step of forming the sealing member 5 in the first recess 2a. First, the material of the sealing member prepared so as to contain the wavelength conversion substance is supplied to the first recess 2a in accordance with a potting method using a dispenser, for example. Next, the resin material is cured by heating with a heating apparatus such as a heater and a reflow furnace. The sealing member 5 is formed accordingly.

The film forming step S14 is a step of forming the film 6 on the sealing member 5. First, a resin material containing the particles 62 in an uncured translucent resin intended to be the base material 61 is supplied onto the sealing member 5 in the first recess 2a in accordance with the potting method, for example. Next, the resin material is cured by heating. The film 6 is formed accordingly. At this time, the particles 62 disposed in the vicinity of the upper surface of the film 6 are covered with the base material 61.

The abrasive-blasting step S15 is a step of roughening the upper surface of the film 6 to the abrasive-blasting. The abrasive-blasting partially exposes at least part of the particles 62 disposed in the vicinity of the upper surface of the film 6, thereby fondling the projections originating from the particles 62 on the upper surface of the film 6.

After the abrasive-blasting, a thickness of the film 6 is equal to ⅗ of the grain sizes of the particles 62 or more than, or preferably equal to ¾ thereof or more than, or more preferably equal to ⅘ thereof or more than. In other words, on the upper surface of the film 6, ⅖ or less of whole sizes of the particles 62 are exposed, or preferably ¼ or less thereof are exposed, or more preferably ⅕ or less thereof are exposed. This film thickness is preferably measured in the vicinity of the center of the first recess 2a in a plan view.

The upper surface of the film 6 is finely roughened by performing the abrasive-blasting in such a way as to expose at least part of the particles 62. Thus, the light diffuseness of the upper surface of the film 6 is improved and it is thus possible to obtain an antireflection effect on the upper surface of the film 6. Meanwhile, it is possible to reduce the surface tackiness of the upper surface of the light emitting device 100 by setting the exposure ratio of the particles 62 on the surface of the film 6 within the aforementioned range. In addition, the particles 62 can be suitably prevented from falling off the film 6 due to the abrasive-blasting.

The abrasive-blasting is preferably conducted in accordance with a wet blasting method, which is carried out by jetting a slurry formed of purified water containing an abrasive material 92 from a nozzle 91 onto a machining target surface, for example. The wet blasting method can reduce impact of the abrasive material 92 on a machining target object as compared to a dry blasting method. Accordingly, the relatively soft base material 61 (the resin material) can be selectively ground off and removed without significantly damaging the particles 62 in the film 6.

Moreover, the abrasive material 92 in smaller diameters can be used in the wet blasting method, and this method is therefore suitable for fine machining. Accordingly, it is possible to remove portions of the base material 61 covering top surfaces of the particles 62 without forming rough bumps on the upper surface of the film 6. This makes it possible to partially expose at least part of the particles 62 to the upper surface of the film 6 and thus to form the projections originating from the particles 62.

At the time of removing the base material 61 covering the upper parts of the particles 62 in the vicinity of the upper surface of the film 6, it is preferable to conduct the abrasive-blasting in such a way as to minimize the detachment of the particles 62 from the base material 61. The grain sizes of the abrasive material 92 are set preferably in a range from about 3 μm to 14 μm inclusive. Here, the use of the abrasive material 92 with small grain sizes of about 3 μm is particularly preferable because such an abrasive material is less likely to cause scratches on the film 6. Meanwhile, when the slurry formed of the purified water containing the abrasive material 92 is used in accordance with the wet blasting method, the content of the abrasive material 92 in the slurry is preferably set in a range from about 5% by volume to 30% by volume inclusive.

The abrasive material 92 preferably has higher hardness than that of the base material 61 of the film 6, and materials such as alumina ($Al_2O_3$), silicon carbide (SiC), stainless steel, zirconia ($ZrO_2$), and glass are applicable thereto.

A blast angle 91a of the slurry containing the abrasive material 92 is set preferably in a range from 15 degrees to 45 degrees inclusive or more preferably near 30 degrees with respect to the upper surface of the film 6 being the machining target surface.

If the abrasive material 92 is jetted onto the machining target surface at the blast angle 91a close to the right angle (90°), the abrasive material 92 may easily stick into the base material 61 and remain in the package 2 after the abrasive-blasting. If the abrasive material 92 is jetted onto the machining target surface at the blast angle 91a close to a horizontal angle, the efficiency of removing the base material 61 with the abrasive material 92 may be reduced. Therefore, by setting the blast angle 91a within the aforementioned range, it is possible to efficiently remove the base material 61 and thus to expose the particles 62 easily.

In the wet blasting method, the above-described slurry and compressed air are sprayed from the nozzle 91 of a blast gun toward the machining target surface. An optimum value of a pressure of the compressed air (a gun pressure of the blast gun) at this time varies with the shape and the blast angle 91a of the nozzle 91, the material, shape, and grain sizes of the abrasive material 92, and the like. Here, the pressure may be set in a range of about 0.1 MPa to 0.5 MPa, for example.

A direction to jet the abrasive material 92 at the above-described blast angle 91a may be set as appropriate depending on the purpose and the usage. In the case of an outdoor display or the like which uses the light emitting device 100 as each pixel, for example, the light emitting device 100 may be required only to suppress a gloss in one direction. In this case, the slurry may be jetted only in one direction D1 in a plan view.

When aiming at suppressing glosses in both directions, it is preferable to jet the abrasive material 92 in the direction D1 and then to jet the abrasive material 92 also in an opposite direction D2 (right side in FIG. 11B) by changing the orientation of the nozzle 9.

Furthermore, the abrasive material 92 may also be jetted also in directions D3 and D4 which are perpendicular to the directions D1 and D2 in a plan view. Alternatively, the abrasive material 92 may be jetted in three directions which are different by 120° from one another in a plan view, for example.

Here, when the abrasive material 92 is jetted in multiple directions, one process in one direction is conducted on the entire upper surface of the film 6 and then another process is conducted while sequentially changing the orientation of the nozzle 91. In the meantime, the orientation of the nozzle 91 may be changed relatively to the light emitting device 100. Hence, the orientation of the light emitting device 100 may be changed while the nozzle 91 is fixed.

The light emitting device 100 is manufactured by carrying out the respective steps as described above.

In the manufacturing method for a light emitting device of this embodiment, in the abrasive blasting, the slurry is jetted onto the upper surface of the film 6 which contains the particles 62. Accordingly, the relatively hard particles 62 remain intact in the film 6 while only the surrounding portion of base material 61 is gradually ground off, and a difference in height is thus created between the particles 62 and the base material 61. As a consequence, the light emitting device 100 is provided with the multiple projections on the upper surface side, and thus reduces the regular reflection light components of the external light. For this reason, a display using the light emitting device 100 as each pixel exerts an antireflection effect, which makes it possible to reduce the influence of the external light and to favorably recognize the brightness and hue of the pixel irrespective of the direction of observation. Moreover, the light emitting device 100 can also exert a tackiness prevention effect since the particles 62 are exposed from the film 6 to the air.

Second Embodiment

Figure 12:
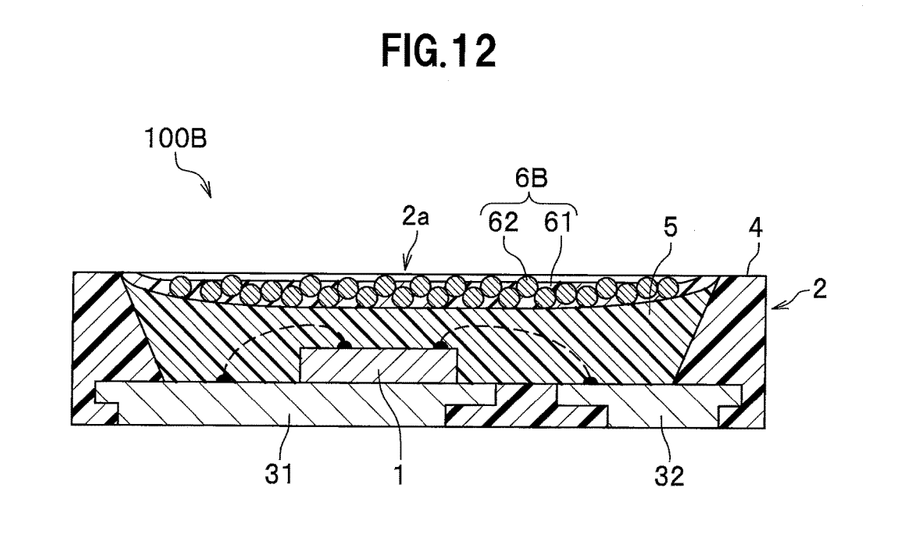
FIG. 12 is a schematic cross-sectional view illustrating a constitution of a light emitting device according to a second embodiment.

FIG. 12 is a schematic cross-sectional view illustrating a constitution of the light emitting device according to the second embodiment. Also, FIG. 12 is the schematic cross-sectional view corresponding to the cross section taken along the III-III line in FIG. 2. A light emitting device 100B according to the second embodiment includes: the package 2; the light emitting element 1 mounted on the package 2; the sealing member 5 encapsulating the light emitting element 1; and a film 6B formed on the sealing member 5. This light emitting device 100B is different from the light emitting device 100 according to the first embodiment in that two or more layers of the particles 62 are stacked in the translucent base material 61 of the film 6B. In the following, the same constituents as those in the light emitting device 100 according to the first embodiment will be denoted by the same reference numerals and explanations thereof will be omitted.

In the light emitting device 100B, the sealing member 5 has a second recess.

The second recess has a substantially curved form in cross-sectional view passing through the optical axis of the light emitting element 1. A height required for flattening the second recess of the sealing member 5 is in a range of 10 µm to 15 µm, for example. In the light emitting device 100B, a resin material containing the particles 62 in an uncured translucent resin intended to be the base material 61 is supplied in accordance with the potting method, for example, so as to flatten the second recess of the sealing member 5 in the first recess 2a, for instance. In this case, the adjacent particles 62 are stacked on one another, thereby forming two or more layers in the case of using the particles 62 with grain sizes in a range of 3 µm to 5 µm, for example. Meanwhile, the area occupied by the particles 62 is greater than the area occupied by the base material 61 in a plan view of the film 6B. Specifically, the particles 62 are disposed so densely in a plan view of the film 6B that particles of the abrasive material 92 contained in the slurry used in the abrasive-blasting do not reach the particles 62 on the lower layer contained in the film 6B. In this state, the particles 62 located on the uppermost layer are partially exposed from the base material 61 by the abrasive-blasting. Here, the formation of two layers of the particles 62 is not limited only to the case of stacking the particles 62 in a vertical direction, but instead means that the film 6B contains the particles 62 in contact with a lower surface (a contact surface) of the base material 61, and the particles 62 not in contact with the lower surface of the base material 61. Here, it is difficult to form the second layer and so forth according to a method of spraying the resin material containing the particles.

Here, in the light emitting device 100B, it is possible to form the film 6B including several layers to ten layers or more as a consequence of stacking the adjacent particles 62 by changing the height to flatten the second recess of the sealing member 5, or by supplying a resin material, which contains the particles 62 in the highly viscous base material 61, onto the sealing member 5 in the first recess 2a so as to form a convex protrusion thereon, for example.

However, the number of stacked layers of the particles 62 in the film 6B is preferably equal to ten layers or below in order to ensure the transmission of the light from the light emitting element 1. Here, in the case where the number of stacked layers of the particles 62 is ten layers, the first layer preferably has a large proportion of the particles 62 in contact with the lower surface of the base material 61 and each of the second to tenth layers preferably has a large proportion of the particles 62 not in contact with the lower surface of the base material 61. In this case, the particles 62 on the first to ninth layers may be buried in the base material 61 while the particles 62 on the tenth layer may be partially exposed.

A display using the light emitting device 100B according to the second embodiment as each pixel exerts an antireflection effect, which makes it possible to reduce the influence of the external light and to favorably recognize the brightness and hue of the pixel irrespective of the direction of observation. Moreover, the light emitting device 100B can also exert a tackiness prevention effect since at least part of the particles 62 are exposed from the film 6B to the air. Furthermore, since two or more layers of the particles 62 are stacked in the translucent base material 61 of the film 6B, the light emitting device 100B can improve diffusion or reflection of the light from the light emitting element 1 as compared to the case of disposing one layer of the particles 62.

EXAMPLES

Next, examples of the present invention will be described.

The light emitting device of the constitution shown in FIG. 1 was produced by the above-described manufacturing method. Here, multiple samples were produced by changing conditions of the abrasive-blasting to render the surface of the film 6 uneven.

Shape and Materials of Light Emitting Device
Package 2:
External dimensions in a plan view: 3 mm each side
Opening sizes of sealing member and film: 2.6 mm each side
Lead electrodes 3: Ag plating on surface of Cu alloy
Light shielding member (light reflective member) 4: heat resistant polymer
Light emitting element 1: mounting one blue LED
Sealing Member 5:
Base material: silicone resin (refractive index 1.52)
Wavelength conversion substance: YAG phosphor
Film 6 (First Film)
Base material 61: silicone resin (refractive index 1.52)
Particles 62: silica ($SiO_2$) (refractive index 1.46, grain sizes 3 µm to 5 µm, content 2% by mass)
Film 6 (Second Film)
Base material 61: silicone resin (refractive index 1.52)
Particles 62: silica ($SiO_2$) (refractive index 1.46, grain sizes 8.5 µm to 12.5 µm, content 2% by mass)
The film 6 was formed by mixing the base material 61 made of the same resin as that used in the base material of the sealing member 5 and the particles 62 made of silica with toluene, potting the mixture on the sealing member 5 formed in the first recess 2a of the package 2, and then drying and curing the mixture. In the meantime, a sample using the particles 62 having the grain sizes in a range of 3 µm to 5 µm was produced as the film 6 (a film coating) and another sample using the particles 62 having the grain sizes in a range of 8.5 µm to 12.5 µm was produced as the film 6 (a second film), respectively.
Conditions of Abrasive-Blasting
Abrasive liquid (slurry):
Solvent: purified water Abrasive: alumina ($Al_2O_3$) (grain size 3 μm, content 5% by volume)
Blast angles: 30°/90°
Blast directions: one direction/two directions in the case of 30°
Gun pressures: 0.2/0.3/0.4 (MPa)
Machining speed: 40 mm/sec.

The upper surfaces of the samples of the light emitting device were abrasive-blasted by applying an air pressure to spray the abrasive liquid from a nozzle as a mist under the above conditions.

In the following, each light emitting device having been provided with the film 6 and abrasive-blasted will also be referred to as an example, and the light emitting device having been provided with the film 6 but not abrasive-blasted will also be referred to as a comparative example.
Evaluation As a consequence of evaluation of characteristics of a comparative example, higher light output (light flux) than that before forming the film 6 was confirmed. In other words, the light extraction becomes better and the light output (the light flux) becomes higher than the case of not providing the film 6 just by providing the upper surface of the sealing member 5 with the film 6 containing the particles 62 having the lower refractive index than that of the base material of the sealing member 5.

The respective samples (examples) produced under different conditions in abrasive-blasting were evaluated for the light output, the light antireflection effect of the upper surface, occurrence of the falling off of the particles 62, and the surface tackiness on the basis of a sample without abrasive blasting (the comparative example).

In terms of the external appearance after the machining, the exposure of the particles 62 to the machined surface was confirmed in all the samples subjected to the abrasive-blasting under the various conditions. The higher the pressure at the blast gun was, the more particles 62 were exposed, and the particles 62 had fallen off the surfaces in some samples.

As a result of measuring the light output (the light flux) of each of the samples, the improvement in the light output (the light flux) was confirmed therefrom. Specifically, when the gun pressure was changed for each sample provided with the film 6 (the first film) using the particles 62 having the grain sizes in the range of 3 μm to 5 μm, the highest light output (the light flux) was confirmed in the case where the gun pressure was equal to 0.3 MPa. On the other hand, when the gun pressure was changed for each sample provided with the film 6 (the second film) using the particles 62 having the grain sizes in the range of 8.5 μm to 12.5 μm, the highest light output (the light flux) was confirmed in the case where the gun pressure was equal to 0.2 MPa.

Meanwhile, the light output was improved by 0.89% as a consequence of averaging the results of the samples provided with the film 6 (the first film) using the particles 62 having the grain sizes in the range of 3 μm to 5 μm. On the other hand, the light output was improved by 0.73% as a consequence of averaging the results of the samples provided with the film 6 (the second film) using the particles 62 having the grain sizes in the range of 8.5 μm to 12.5 μm.

When the blast angle was set to 90°, that is, when the abrasive material was jetted at the right angle with respect to the machined surface, it was confirmed that the amount of exposure of the particles 62 was less than that in the case of setting the blast angle to 30°. In the meantime, when the slurry was jetted in one direction while setting the blast angle to 30°, the surfaces of the particles 62 facing the blast direction were exposed but the surfaces thereof on the opposite side were shaded by the particles 62 themselves and were not exposed very much. By using the two blasting directions, the amount of exposure of the particles 62 was increased. Here, the amount of exposure was increased more than that in the case of setting the blast angle equal to 90°. This is thought to be because the abrasive material 92 could grind off the base material 61 more easily as a consequence of setting the blast angle smaller than the right angle.

Moreover, regarding each sample in abrasive-blasting (the example), the presence of the antireflection effect of the external light as compared to the sample without abrasive-blasting (the comparative example) was visually confirmed.

Furthermore, regarding the sample in abrasive-blasting (example), reduction in tackiness on the upper surface of the film 6 was confirmed.

On the other hand, the effect to prevent the tackiness was not confirmed very much from the sample without abrasive-blasting (the comparative example).

However, the reduction in tackiness was observed after exposing the particles 62 by abrasive-blasting the comparative example.

The light emitting devices according to the embodiments of the present disclosure are applicable to: backlight light sources for liquid crystal displays; various lighting devices; large displays; various display devices such as advertisement billboards and destination boards; image reading devices used in apparatuses such as digital video cameras, facsimiles, copiers, and scanners; projector devices; and the like.

Obviously, numerous modifications and variations of the present invention are possible in light of the above teachings. It is therefore to be understood that within the scope of the appended claims, the invention may be practiced otherwise than as specifically described herein.

What is claimed is:
1. A method for manufacturing a light emitting device, comprising:
providing a package having a recess in which a light emitting element is disposed;
providing a translucent sealing material in the recess to encapsulate the light emitting element;
providing a film on the translucent sealing material, the film including a translucent base material and particles disposed in the translucent base material, the film having a contact surface to contact the translucent sealing material and an outer surface opposite to the contact surface; and
blasting abrasive onto the outer surface of the film to roughen the outer surface so as to expose at least one of the particles.
2. The method according to claim 1, wherein the abrasive includes a slurry comprising water and an abrasive material.
3. The method according to claim 2, wherein the slurry is jetted onto the outer surface of the film at an angle to the outer surface of the film in a range from 15° to 45°.
4. The method according to claim 2, wherein the slurry is jetted only in one direction in a plan view.
5. The method according to claim 2, wherein the slurry is jetted sequentially in equal to two or more different directions in a plan view.
6. The method according to claim 1,
wherein grain sizes of the particles in the film are in a range from 0.5 μm to 12.5 μM measured in accordance with an air permeability method or Fisher-SubSieve-Sizers-No., and wherein a thickness of the film formed after the abrasive is blasted is equal to or more than 3/5 of the grain sizes of the particles.

7. The method according to claim 1, wherein the particles in the film are made of silica.

8. The method according to claim 1, wherein the base material of the film comprises a material selected from an epoxy resin and a silicone resin.

9. The method according to claim 1,
wherein each of the particles in the film have a particle refractive index smaller than a base material refractive index that the base material of the film has, and
wherein a difference between the particle refractive index and the base material refractive index is equal to 0.03 or more.

10. The method according to claim 1,
wherein the at least one of the particles is partially exposed after the abrasive is blasted onto the outer surface of the film.

11. The method according to claim 2, wherein the abrasive is blasted with wet blasting method.

* * * * *